United States Patent
Steere

(10) Patent No.: US 12,374,539 B2
(45) Date of Patent: Jul. 29, 2025

(54) INTERPOSER WITH LOAD HOLE FOR ION TRAP

(71) Applicant: IonQ, Inc., College Park, MD (US)

(72) Inventor: James Walker Steere, College Park, MD (US)

(73) Assignee: IonQ, Inc., College Park, MD (US)

(\*) Notice: Subject to any disclaimer, the term of this patent is extended or adjusted under 35 U.S.C. 154(b) by 236 days.

(21) Appl. No.: 17/877,261

(22) Filed: Jul. 29, 2022

(65) Prior Publication Data

US 2023/0035661 A1    Feb. 2, 2023

Related U.S. Application Data

(60) Provisional application No. 63/227,127, filed on Jul. 29, 2021.

(51) Int. Cl.
   *H01J 49/42* (2006.01)

(52) U.S. Cl.
   CPC .................. *H01J 49/422* (2013.01)

(58) Field of Classification Search
   CPC .......... H01J 49/00; H01J 49/02; H01J 49/422; H01J 49/0404; H01J 49/06; H01J 49/062; H01J 49/063; H01J 49/065; G06N 10/40; H01L 25/18; G21K 1/00
   USPC .................. 250/281, 282, 288, 489
   See application file for complete search history.

(56) References Cited

U.S. PATENT DOCUMENTS

| | | | |
|---|---|---|---|
| 7,259,466 B2* | 8/2007 | Freeman | H05K 3/4629 257/782 |
| 10,840,078 B1* | 11/2020 | Youngner | H01J 49/0468 |
| 11,056,332 B1* | 7/2021 | Maunz | G06N 10/00 |
| 2007/0013057 A1* | 1/2007 | Mazzochette | H01L 25/0753 257/E33.059 |
| 2019/0027355 A1* | 1/2019 | Kim | H01J 49/16 |
| 2020/0335685 A1* | 10/2020 | Shao | H10N 60/01 |
| 2022/0037221 A1* | 2/2022 | Arayama | C08G 59/621 |

FOREIGN PATENT DOCUMENTS

KR     2019048956 A  *  5/2019  ............ H01J 49/424

\* cited by examiner

*Primary Examiner* — Jason L McCormack
(74) *Attorney, Agent, or Firm* — ARENTFOX SCHIFF LLP

(57) ABSTRACT

An interposer is described that is made from an electrically insulating, thermally efficient substrate (e.g., sapphire) and has a load hole for use with ion traps in atomic-based QIP architectures. The interposer load hole aligns with a load hole in the ion trap such that atomic species can be provided from the back of the interposer to the front of the ion trap for ionization and confinement. The interposer may include angled traces for wire bonding to the ion trap, where the angled traces enable more open light access when using laser or optical beams during operation of the ion trap. Electrical routing in the interposer may involve more than one layer of routing, separated by an insulating dielectric material such as a polyimide. Routing in the interposer may also contain active electronic components. The load hole in the interposer may have a straight or tapered inner wall.

20 Claims, 7 Drawing Sheets

INTERPOSER WITH LOAD HOLE FOR ION TRAP

PRIORITY

This application claims priority to and the benefit from U.S. Provisional Application No. 63/227,127, filed on Jul. 29, 2021, and titled "Interposer with Load Hole for Ion Trap," the contents of which are incorporated herein by reference in their entirety.

BACKGROUND

Aspects of the present disclosure relate generally to trapping devices for use in the implementation, operation, and/or use of quantum information processing (QIP) systems.

Trapped atoms are one of the leading implementations for quantum information processing or quantum computing. Atomic-based qubits may be used as quantum memories, as quantum gates in quantum computers and simulators, and may act as nodes for quantum communication networks. Qubits based on trapped atomic ions enjoy a rare combination of attributes. For example, qubits based on trapped atomic ions have very good coherence properties, may be prepared and measured with nearly 100% efficiency, and are readily entangled with each other by modulating their Coulomb interaction with suitable external control fields such as optical or microwave fields. These attributes make atomic-based qubits attractive for extended quantum operations such as quantum computations or quantum simulations.

It is therefore important to develop new techniques that improve the design, fabrication, implementation, control, components, and/or functionality of different QIP systems used as quantum computers or quantum simulators, and particularly for those QIP systems that handle operations based on atomic-based qubits.

SUMMARY

The following presents a simplified summary of one or more aspects to provide a basic understanding of such aspects. This summary is not an extensive overview of all contemplated aspects and is intended to neither identify key or critical elements of all aspects nor delineate the scope of any or all aspects. Its sole purpose is to present some concepts of one or more aspects in a simplified form as a prelude to the more detailed description that is presented later.

This disclosure describes various aspects of an interposer made from an electrically insulating, thermally efficient substrate (e.g., sapphire) that has a load hole for use with ion traps in atomic-based QIP architectures. The load hole in the interposer is configured to align with a corresponding load hole in the ion trap such that atomic species can be provided from the back of the interposer to the front of the ion trap for ionization and confinement. The interposer may include angled traces for wire bonding to the ion trap, where the angled traces enable more open light access when using laser or optical beams during operation of the ion trap. Electrical routing in the interposer may involve more than one layer of routing, separated by an insulating dielectric material such as a polyimide. Routing in the interposer may also contain active electronic components (e.g., logical circuits, analog circuits, amplifiers, etc.). The load hole in the interposer may be straight or tapered as it goes through the thickness of the interposer.

This disclosure describes various aspects of a device, system, assembly, or module that includes both an ion trap and an interposer with a load hole that aligns with a load hole in the ion trap. The device, system, assembly, or module may be configured to operate in a room temperature or a cryogenic ultra-high-vacuum (UHV) environment.

This disclosure describes various aspects of a QIP system that includes a device, system, assembly, or module having both an ion trap and an interposer with a load hole that aligns with a load hole in the ion trap. The device, system, assembly, or module may operate inside a chamber of the QIP system in a room temperature or a cryogenic UHV environment To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Figure 1:
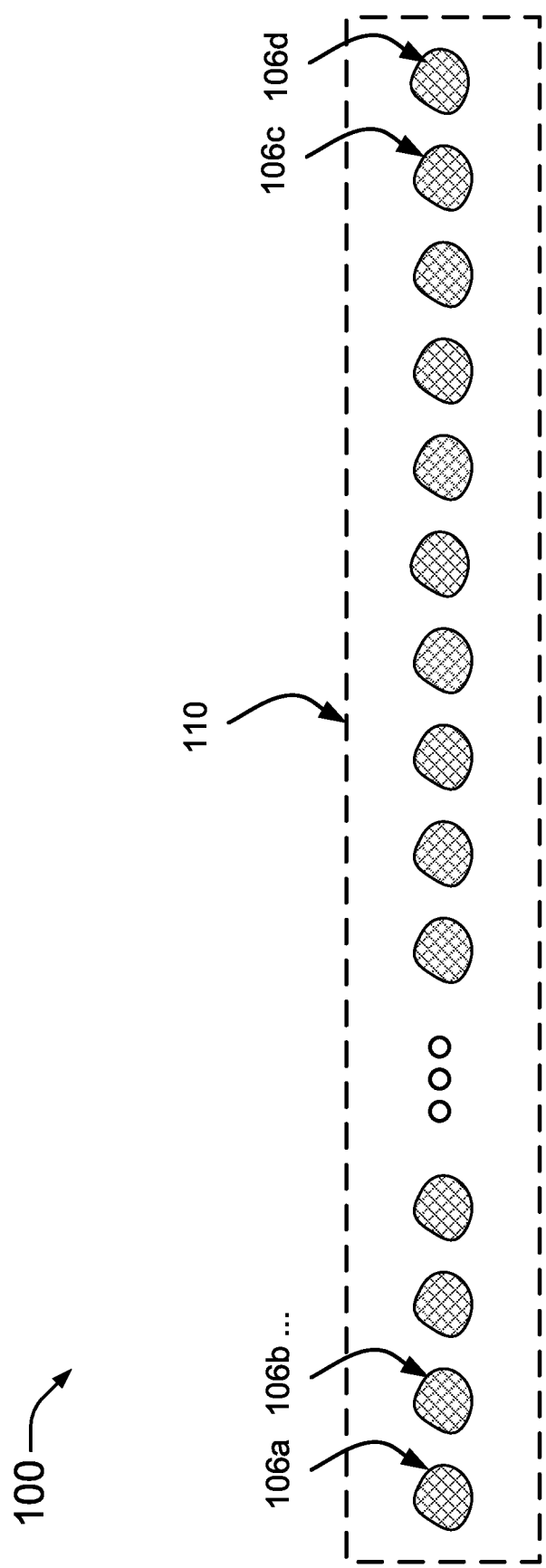
FIG. 1 illustrates a view of atomic ions a linear crystal or chain in accordance with aspects of this disclosure.

The detailed description set forth below in connection with the appended drawings or figures is intended as a description of various configurations or implementations and is not intended to represent the only configurations or implementations in which the concepts described herein may be practiced. The detailed description includes specific details for the purpose of providing a thorough understanding of various concepts. However, it will be apparent to those skilled in the art that these concepts may be practiced without these specific details or with variations of these specific details. In some instances, well known components are shown in block diagram form, while some blocks may be representative of one or more well known components.

In QIP systems that use qubits based on trapped ions, the reduction in size of the ion trap and the high numerical aperture (NA) optical access requirements (e.g., of the laser or optical beams for the qubits) may involve routing electrical connections closer to the ion trap than what is possible with existing carriers or interposers (e.g., substrates on which the ion traps are placed). Thus, improvements in carrier or interposer design or configuration may be helpful in this regard.

The heat load induced by operation of the ion traps at radio frequency (RF) high voltages may be better handled by having a thermally conductive heat sink underneath the trap. Thus, the use of a thermally conductive carrier or interposer may also help to improve the heat load on the ion trap.

An interposer may be configured to provide better optical access and to keep carrier-level wiring and pad distribution less dependent on the ion trap configuration.

Moreover, to load ions (e.g., load atomic species that are subsequently ionized for confinement) into an ion trap, loading must be done either from the topside or top surface of the ion trap or from the back surface through a slot/hole in the ion trap (and any underlying substrates). The latter loading technique may be preferred in some configurations due to risk of device electrode contamination from topside atomic plume loading and overcomplication from front loading methods using a magneto-optic-trap (MOT).

Existing solutions to backside or back surface loading when using interposers for electrical routing generally place the interposers on either end of the ion trap as part of a more complicated stackup, which may sometimes require yet another substrate or carrier in addition to the interposer. Most often when backside loading is used, ion traps are mounted directly to ceramics that are easier to shape and have holes cut into them.

The present disclosure describes an electrically insulating, thermally efficient substrate such as sapphire, for example, as an interposer, where the interposer has a load hole for use in backside or back surface loading. The interposer load hole can be straight or tapered (e.g., the interior wall in the load hole is straight or tapered) and the interior wall of the hole can be metalized or can be left exposed. The interposer load hole is configured to align with the load hole of the ion trap attached to and placed directly on the interposer. An example of another thermally efficient substrate material is beryllium oxide (BeO), which is a good thermal conductor at room temperature and can be used to make an interposer with a load hole.

The structure described herein provides an efficient heat sink under cryogenic operating conditions (e.g., by use of sapphire as the interposer material), electrical routing via substrate topside, and a hole for loading, all in a single monolithic piece. This approach simplifies assembly and minimizes alignment tolerances needed for stackups that include an ion trap over a carrier or interposer. Moreover, the combination of the ion trap and interposer described herein may operate in a room temperature or a cryogenic ultra-high-vacuum (UHV) environment.

Solutions to the issues described above are explained in more detail in connection with FIGS. 1-7, with FIGS. 1-3 providing a background of QIP systems or quantum computers, and more specifically, of atomic-based QIP systems or quantum computers.

Figure 2:
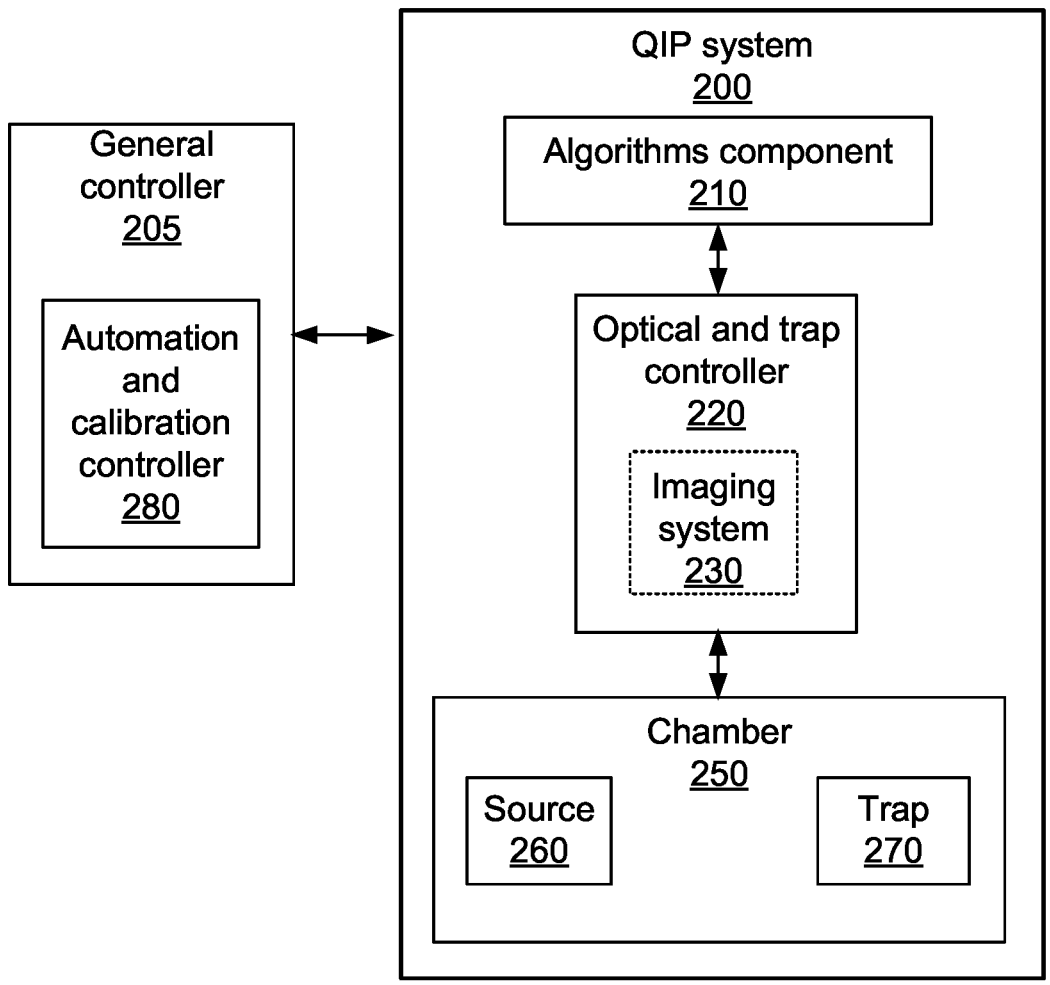
FIG. 2 illustrates an example of a quantum information processing (QIP) system in accordance with aspects of this disclosure.

FIG. 1 illustrates a diagram 100 with multiple atomic ions or ions 106 (e.g., ions 106a, 106b, . . . , 106c, and 106d) trapped in a linear crystal or chain 110 using a trap (not shown; the trap can be inside a vacuum chamber as shown in FIG. 2). The trap may be referred to as an ion trap. The ion trap shown may be built or fabricated on a semiconductor substrate, a dielectric substrate, or a glass die or wafer (also referred to as a glass substrate). The ions 106 may be provided to the trap as atomic species for ionization and confinement into the chain 110. Some or all of the ions 106 may be configured to operate as qubits in a QIP system.

The ion trap may be attached to or placed on a carrier or interposer and loading of the atomic species to be ionized into the ions 106 in the chain 110 may be provided directly to the front of the ion trap (e.g., frontside or front/top surface loading) or from the back of the ion trap or the ion trap on an interposer (e.g., backside or back surface loading) through a hole in the ion trap. The interposer may provide an efficient heat sink under cryogenic operating conditions, electrical routing via substrate topside, and a hole for loading, all in a single monolithic piece. Several features of ion traps and the interposers used with the ion traps are described in more detailed below in connection with FIGS. 4-7.

In the example shown in FIG. 1, the trap includes electrodes (not shown) for trapping or confining multiple ions into the chain 110 laser-cooled to be nearly at rest. The number of ions trapped can be configurable and more or fewer ions may be trapped. The ions can be ytterbium ions (e.g., $^{171}Yb^+$ ions), for example. The ions are illuminated with laser (optical) radiation tuned to a resonance in $^{171}Yb^+$ and the fluorescence of the ions is imaged onto a camera or some other type of detection device (e.g., photomultiplier tube or PMT). In this example, ions may be separated by a few microns (μm) from each other, although the separation may vary based on architectural configuration. The separation of the ions is determined by a balance between the external confinement force and Coulomb repulsion and does not need to be uniform. Moreover, in addition to ytterbium ions, barium atoms, neutral atoms, Rydberg atoms, or other types of atomic-based qubit technologies may also be used. Moreover, ions of the same species, ions of different species, and/or different isotopes of ions may be used. The trap may be a linear RF Paul trap, but other types of confinement devices may also be used, including optical confinements. Thus, a confinement device may be based on different techniques and may hold ions, neutral atoms, or Rydberg atoms, for example, with an ion trap being one example of such a confinement device. The ion trap may be a surface trap, for example.

FIG. 2 illustrates a block diagram that shows an example of a QIP system 200. The QIP system 200 may also be referred to as a quantum computing system, a quantum computer, a computer device, a trapped ion system, or the like. The QIP system 200 may be part of a hybrid computing system in which the QIP system 200 is used to perform quantum computations and operations and the hybrid computing system also includes a classical computer to perform classical computations and operations. The quantum and classical computations and operations may interact in such a hybrid system.

Shown in FIG. 2 is a general controller 205 configured to perform various control operations of the QIP system 200. These control operations may be performed by an operator, may be automated, or a combination of both. Instructions for at least some of the control operations may be stored in memory (not shown) in the general controller 205 and may be updated over time through a communications interface (not shown). Although the general controller 205 is shown separate from the QIP system 200, the general controller 205 may be integrated with or be part of the QIP system 200. The general controller 205 may include an automation and calibration controller 280 configured to perform various calibration, testing, and automation operations associated with the QIP system 200. These calibration, testing, and automation operations may involve, for example, all or part of an algorithms component 210, all or part of an optical and trap controller 220 and/or all or part of a chamber 250.

The QIP system 200 may include the algorithms component 210 mentioned above, which may operate with other parts of the QIP system 200 to perform or implement quantum algorithms, quantum applications, or quantum operations. The algorithms component 210 may be used to perform or implement a stack or sequence of combinations of single qubit operations and/or multi-qubit operations (e.g., two-qubit operations) as well as extended quantum computations. The algorithms component 210 may also include software tools (e.g., compilers) that facility such performance or implementation. As such, the algorithms component 210 may provide, directly or indirectly, instructions to various components of the QIP system 200 (e.g., to the optical and trap controller 220) to enable the performance or implementation of the quantum algorithms, quantum applications, or quantum operations. The algorithms component 210 may receive information resulting from the performance or implementation of the quantum algorithms, quantum applications, or quantum operations and may process the information and/or transfer the information to another component of the QIP system 200 or to another device (e.g., an external device connected to the QIP system 200) for further processing.

The QIP system 200 may include the optical and trap controller 220 mentioned above, which controls various aspects of a trap 270 in the chamber 250, including the generation of signals to control the trap 270. For example, the optical and trap controller 220 may be configured to control the generation of radio frequency (RF) signals to be applied to RF electrodes in the trap 270 and direct current (DC) signals to be applied to DC electrodes in the trap 270. The trap 270 may be an ion trap and may be configured to be attached to or placed on an interposer, where the interposer is configured to provide an efficient heat sink under cryogenic operating conditions, electrical routing via substrate topside, and a hole for loading, all in a single monolithic piece. Thus, in the diagram 200, the reference to the trap 270 may also be a reference to an assembly that has the trap 270 and an interposer attached to the trap 270. Several features of ion traps on interposers related to this disclosure are described in more detail below in connection with FIGS. 4-7.

The optical and trap controller 220 may also control the operation of lasers, optical systems, and optical components that are used to provide the optical beams that interact with the atoms or ions in the trap. Optical systems that include multiple components may be referred to as optical assemblies. The optical beams are used to set up the ions, to perform or implement quantum algorithms, quantum applications, or quantum operations with the ions, and to read results from the ions. Control of the operations of laser, optical systems, and optical components may include dynamically changing operational parameters and/or configurations, including controlling positioning using motorized mounts or holders. When used to confine or trap ions, the trap 270 may be referred to as an ion trap. The trap 270, however, may also be used to trap neutral atoms, Rydberg atoms, and other types of atomic-based qubits. The lasers, optical systems, and optical components can be at least partially located in the optical and trap controller 220, an imaging system 230, and/or in the chamber 250.

The QIP system 200 may include the imaging system 230. The imaging system 230 may include a high-resolution imager (e.g., CCD camera) or other type of detection device (e.g., PMT) for monitoring the ions while they are being provided to the trap 270 and/or after they have been provided to the trap 270 (e.g., to read results). In an aspect, the imaging system 230 can be implemented separate from the optical and trap controller 220, however, the use of fluorescence to detect, identify, and label ions using image processing algorithms may need to be coordinated with the optical and trap controller 220.

In addition to the components described above, the QIP system 200 can include a source 260 that provides atomic species (e.g., a plume or flux of neutral atoms) to the chamber 250 having the trap 270. When atomic ions are the basis of the quantum operations, that trap 270 confines the atomic species once ionized (e.g., photoionized). The trap 270 may be part of what may be referred to as a processor or processing portion of the QIP system 200. That is, the trap 270 may be considered at the core of the processing operations of the QIP system 200 since it holds the atomic-based qubits that are used to perform or implement the quantum operations or simulations. At least a portion of the source 260 may be implemented separate from the chamber 250.

It is to be understood that the various components of the QIP system 200 described in FIG. 2 are described at a high-level for ease of understanding. Such components may include one or more sub-components, the details of which may be provided below as needed to better understand certain aspects of this disclosure.

Aspects of this disclosure may be implemented at least partially using the trap 270.

Figure 3:
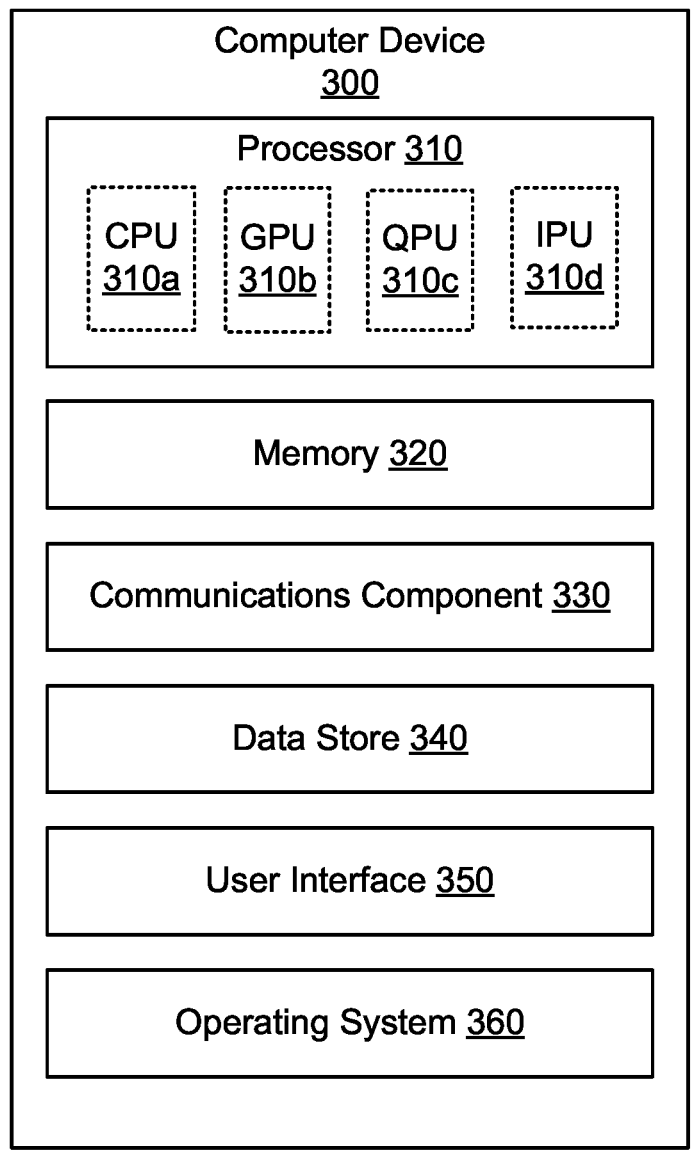
FIG. 3 illustrates an example of a computer device in accordance with aspects of this disclosure.

Referring now to FIG. 3, an example of a computer system or device 300 is shown. The computer device 300 may represent a single computing device, multiple computing devices, or a distributed computing system, for example. The computer device 300 may be configured as a quantum computer (e.g., a QIP system), a classical computer, or to perform a combination of quantum and classical computing functions, sometimes referred to as hybrid functions or operations. For example, the computer device 300 may be used to process information using quantum algorithms, classical computer data processing operations, or a combination of both. In some instances, results from one set of operations (e.g., quantum algorithms) are shared with another set of operations (e.g., classical computer data processing). A generic example of the computer device 300 implemented as a QIP system capable of performing quantum computations and simulations is, for example, the QIP system 200 shown in FIG. 2.

The computer device 300 may include a processor 310 for carrying out processing functions associated with one or more of the features described herein. The processor 310 may include a single processor, multiple set of processors, or one or more multi-core processors. Moreover, the processor 310 may be implemented as an integrated processing system and/or a distributed processing system. The processor 310 may include one or more central processing units (CPUs) 310a, one or more graphics processing units (GPUs) 310b, one or more quantum processing units (QPUs) 310c, one or more intelligence processing units (IPUs) 310d (e.g., artificial intelligence or AI processors), or a combination of some or all those types of processors. In one aspect, the processor 310 may refer to a general processor of the computer device 300, which may also include additional processors 310 to perform more specific functions (e.g., including functions to control the operation of the computer device 300). Quantum operations may be performed by the QPUs 310c. Some or all of the QPUs 310c may use atomic-based qubits, however, it is possible that different QPUs are based on different qubit technologies. The QPUs 310c may use ion traps attached to or placed on interposers that are configured for backside or back surface loading through an interposer load hole, while also providing efficient heat sink under cryogenic operating conditions and electrical routing via the interposer's top surface.

The computer device 300 may include a memory 320 for storing instructions executable by the processor 310 to carry out operations. The memory 320 may also store data for processing by the processor 310 and/or data resulting from processing by the processor 310. In an implementation, for example, the memory 320 may correspond to a computer-readable storage medium that stores code or instructions to perform one or more functions or operations. Just like the processor 310, the memory 320 may refer to a general memory of the computer device 300, which may also include additional memories 320 to store instructions and/or data for more specific functions.

It is to be understood that the processor 310 and the memory 320 may be used in connection with different operations including but not limited to computations, calculations, simulations, controls, calibrations, system management, and other operations of the computer device 300, including any methods or processes described herein.

Further, the computer device 300 may include a communications component 330 that provides for establishing and maintaining communications with one or more parties utilizing hardware, software, and services. The communications component 330 may also be used to carry communications between components on the computer device 300, as well as between the computer device 300 and external devices, such as devices located across a communications network and/or devices serially or locally connected to computer device 300. For example, the communications component 330 may include one or more buses, and may further include transmit chain components and receive chain components associated with a transmitter and receiver, respectively, operable for interfacing with external devices. The communications component 330 may be used to receive updated information for the operation or functionality of the computer device 300.

Additionally, the computer device 300 may include a data store 340, which can be any suitable combination of hardware and/or software, which provides for mass storage of information, databases, and programs employed in connection with the operation of the computer device 300 and/or any methods or processes described herein. For example, the data store 340 may be a data repository for operating system 360 (e.g., classical OS, or quantum OS, or both). In one implementation, the data store 340 may include the memory 320. In an implementation, the processor 310 may execute the operating system 360 and/or applications or programs, and the memory 320 or the data store 340 may store them.

The computer device 300 may also include a user interface component 350 configured to receive inputs from a user of the computer device 300 and further configured to generate outputs for presentation to the user or to provide to a different system (directly or indirectly). The user interface component 350 may include one or more input devices, including but not limited to a keyboard, a number pad, a mouse, a touch-sensitive display, a digitizer, a navigation key, a function key, a microphone, a voice recognition component, any other mechanism capable of receiving an input from a user, or any combination thereof. Further, the user interface component 350 may include one or more output devices, including but not limited to a display, a speaker, a haptic feedback mechanism, a printer, any other mechanism capable of presenting an output to a user, or any combination thereof. In an implementation, the user interface component 350 may transmit and/or receive messages corresponding to the operation of the operating system 360. When the computer device 300 is implemented as part of a cloud-based infrastructure solution, the user interface component 350 may be used to allow a user of the cloud-based infrastructure solution to remotely interact with the computer device 300.

In connection with the systems described in FIGS. 1-3, it would be helpful to improve on the design of interposer to help in the operation and performance of ion traps, and therefore, improve on the overall operation and performance of a QIP system.

Figure 4:
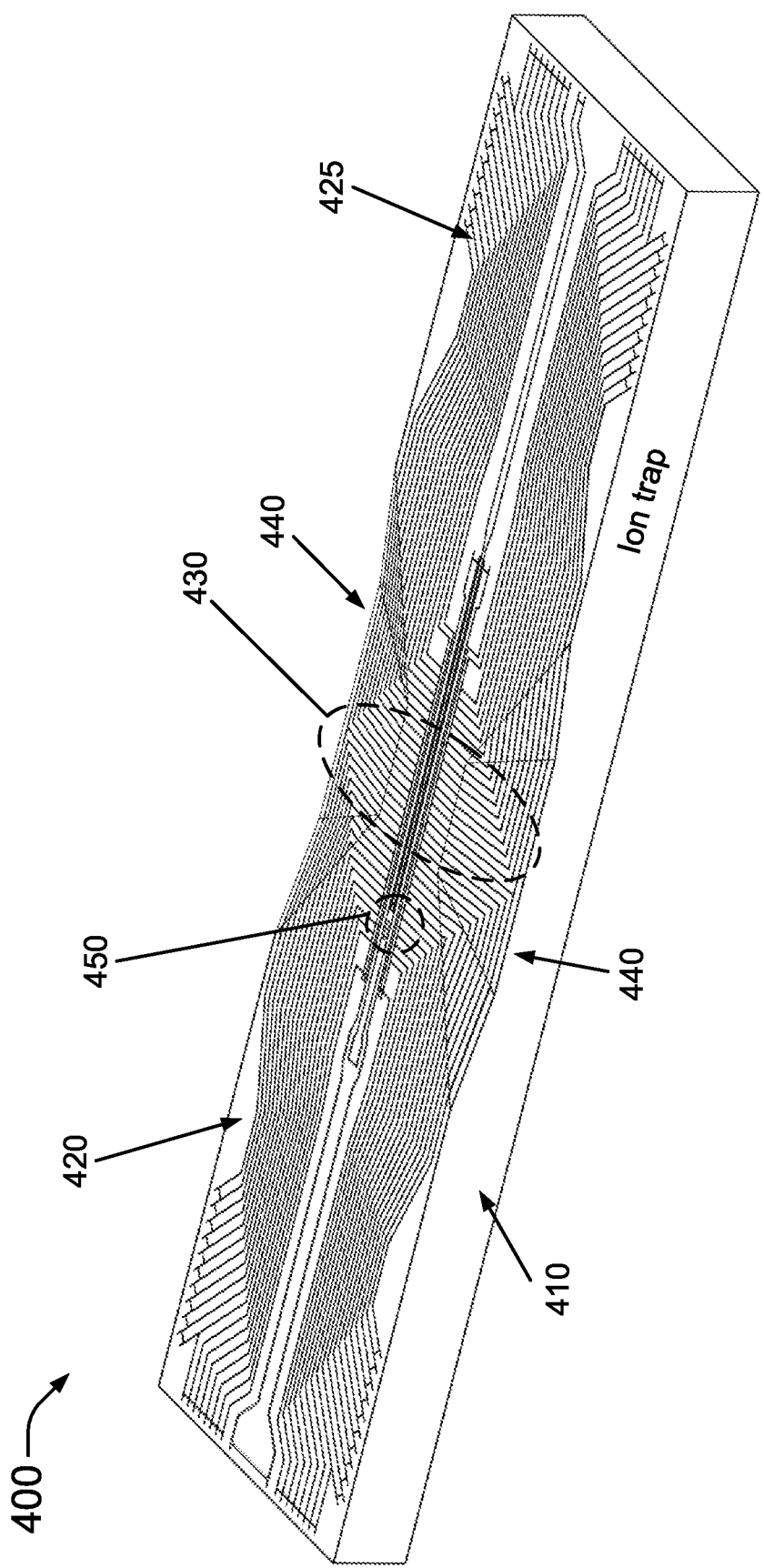
FIG. 4 illustrates an isometric view of an example of an ion trap in connection with aspects of this disclosure.

FIG. 4 shows a diagram 400 that illustrates an isometric view of an ion trap. The ion trap shown may be built or fabricated on a die or wafer 410, also referred to as a substrate 410. The substrate 410 can be made of different materials, including glass, in which case it may be referred to as a glass substrate. When made out of glass, the glass substrate may be made out of fused silica, however, other glass-like materials may also be used. As shown, the substrate 410 may be an elongated device, where one direction may be along the length of the device and another direction may be along the width of the device. Although shown to have a rectangular shape in this example, the substrate 410 need not be limited to such a shape.

In an example, the ion trap may be fabricated using a layer of metal 425 that is evaporated, sputtered, or otherwise deposited over a surface or surfaces 420 of a glass substrate, where the surface or surfaces 420 are appropriately etched or shaped to produce grooves and undercuts that provide isolation between electrodes formed by the metal layer 425. The surface 420 may be referred to as a top surface when it is the topmost surface of the substrate 410. This metal layer 425 may be a single metal layer, however, multiple metal layers may also be used. The metal layer 425 may be made of pure metals or alloys. The electrodes that are formed over the surface 420 are routed from both ends of the ion trap (e.g., the distal ends of the ion trap) to a center or middle region 430 of the ion trap. As shown, at the distal ends of the trap the electrodes may be angled to facilitate wire bonding between the electrodes on the ion trap and electrical traces on a substrate or interposer (not shown) onto which the ion trap is placed. The angles can range from, for example, 15 degrees to 60 degrees, although 45 degrees angles are shown in this case. The angled electrodes and wire bonds provide additional clear access by a laser or optical beam.

It is in the region 430 that the other end of the electrodes terminate and where the ions 106 in the linear crystal or chain 110 illustrated in FIG. 1 are trapped. When the ion traps described herein are made by evaporation of the metal layer 425 on a glass substrate the ion traps may be referred to as evaporated glass traps or EGTs. Aspects of this disclosure need not be limited to EGTs and other types of ion traps may also be used.

As a variation of the structure described above, rather than using a layer of metal 425, a layer of a non-metallic conductive coating 425 may be used instead. An example of a non-metallic conductive material is indium tin oxide (ITO), but other such materials may also be used.

The ion trap shown in the diagram 400 in FIG. 4 may include features for electrodes with metalized trenches and open light access. These ion traps may be fabricated by shaping the top surface of a glass substrate and then evaporating one or more metal layers 425 over the shaped top surface. Regions shadowed by overhangs in the glass form disconnects between regions of metal, allowing for many isolated electrodes on a single device. Further shaping of the trap may be achieved by, for example, forming beveled, slanted, or angled cutout regions 440, which may provide light access improvements over that of a flat surface (e.g., high numerical aperture (NA) light access). For example, better access by a focused laser or optical beam can be provided to the trapped ions by removing portions of the that could otherwise interfere with the focused laser or optical beam. That is, a high NA light access may be achieved by cutting or shaping angled wings into the glass substrate to allow tightly focused laser beams to reach the center of the ion trap without clipping. By angling the cuts, the features that create the electrodes may extend over these regions to improve the ion trap's electrical connectivity. As an alternate aspect, these wings could also be flat (e.g., flat cutouts) and provide mechanical strength without the improved electrical connectivity.

The metallization used in the evaporation process to form the electrodes can include a single metal (e.g., gold (Au)) or a layering of different metals (e.g., chromium (Cr) then Au). As mentioned above, metal alloys that provide the appropriate mechanical and electrical properties may also be used in the metal evaporation process. Ion traps that rely on features or fabrication methods different from those described above may also be used.

Also shown in the diagram 400 in FIG. 4 is an ion trap load hole 450 positioned somewhat off center in the ion trap but near the region 430. This ion trap load hole 450 extends through the entire thickness of the ion trap and allows for a plume of atomic species to be provided through a back surface of the ion trap for subsequent ionization and trapping over the top surface of the ion trap.

Figure 5:
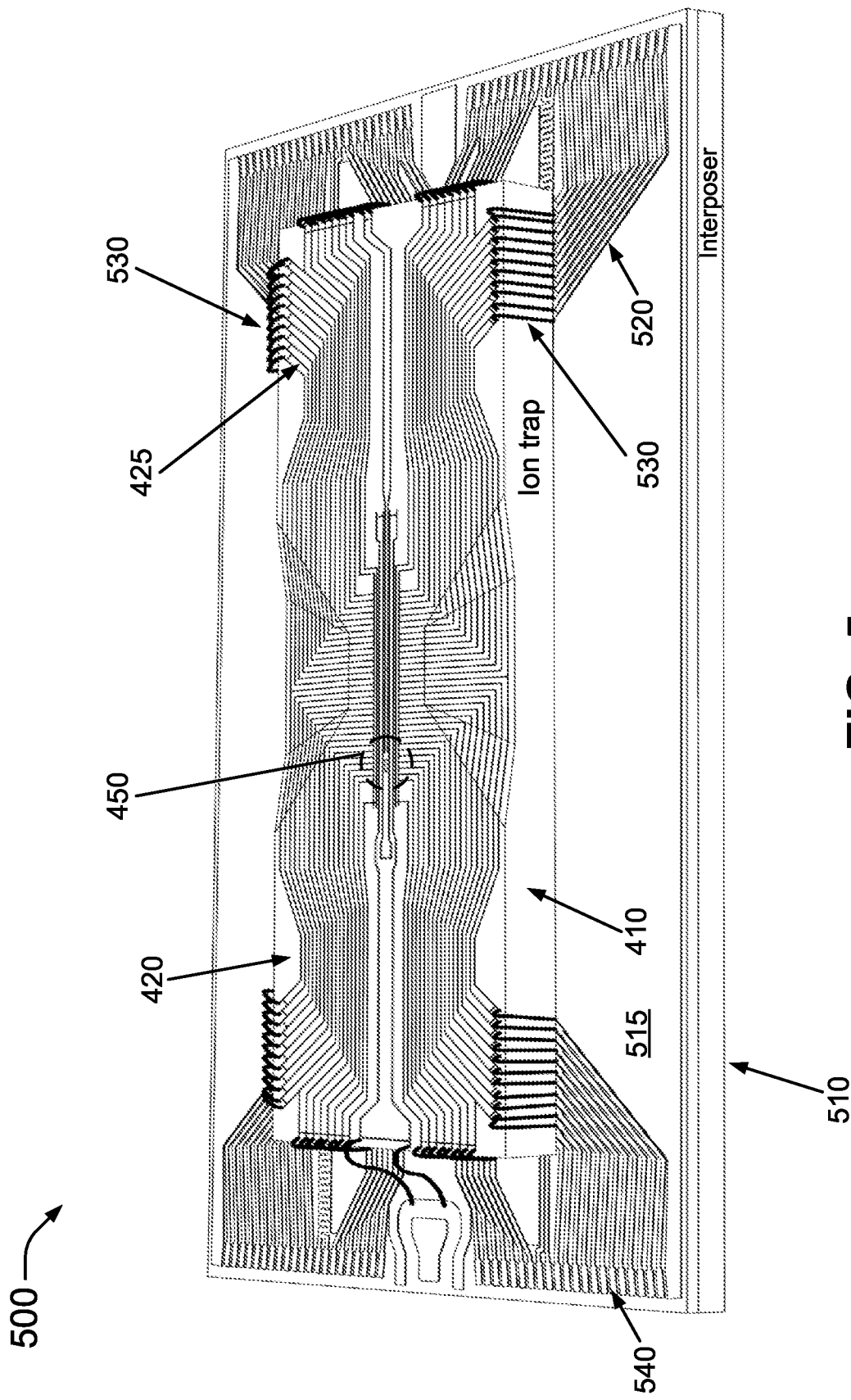
FIG. 5 illustrates an example of an ion trap on an interposer in connection with aspects of this disclosure.

FIG. 5 shows a diagram 500 that illustrates a device, system, assembly, or module that combines an ion trap attached to an interposer. In this example, a back surface of the substrate 410 of the ion trap is placed in contact with and mechanically (e.g., rigidly) attached to a top surface 515 of a substrate 510 of the interposer. The top surface 420 and the electrodes formed by the metal layer 425 are shown at the top of the assembly. Also shown are wire bonds 530 between angled ends of the electrodes of the ion trap and angled ends of traces 520 on the top surface 515 of the interposer. In some examples, active components such as digital circuits, analog circuits, amplifiers, and/or a combination thereof may be included in the interposer and connected to the traces 520 as needed.

As shown in this example, the area of the interposer is larger than the area of the ion trap such that substantially most of the back surface of the ion trap is in contact with the interposer for the interposer to be used as a heat sink during operation of the ion trap. The interposer may further include contacts 540 that allow electrical connectivity of the assembly to other components in a QIP system. For example. although not shown explicitly in the diagram 500 in FIG. 5, the interposer may be placed or positioned directly on a ceramic carrier and there may be additional wires bonded to the contacts 540 to connect the interposer to the ceramic carrier.

The diagram 500 also shows the location of the ion trap load hole 450 slightly to the left of the center of the ion trap. As mentioned above, atomic species are provided through the ion trap load hole 450 for ionization and confinement by the ion trap.

Figure 6:
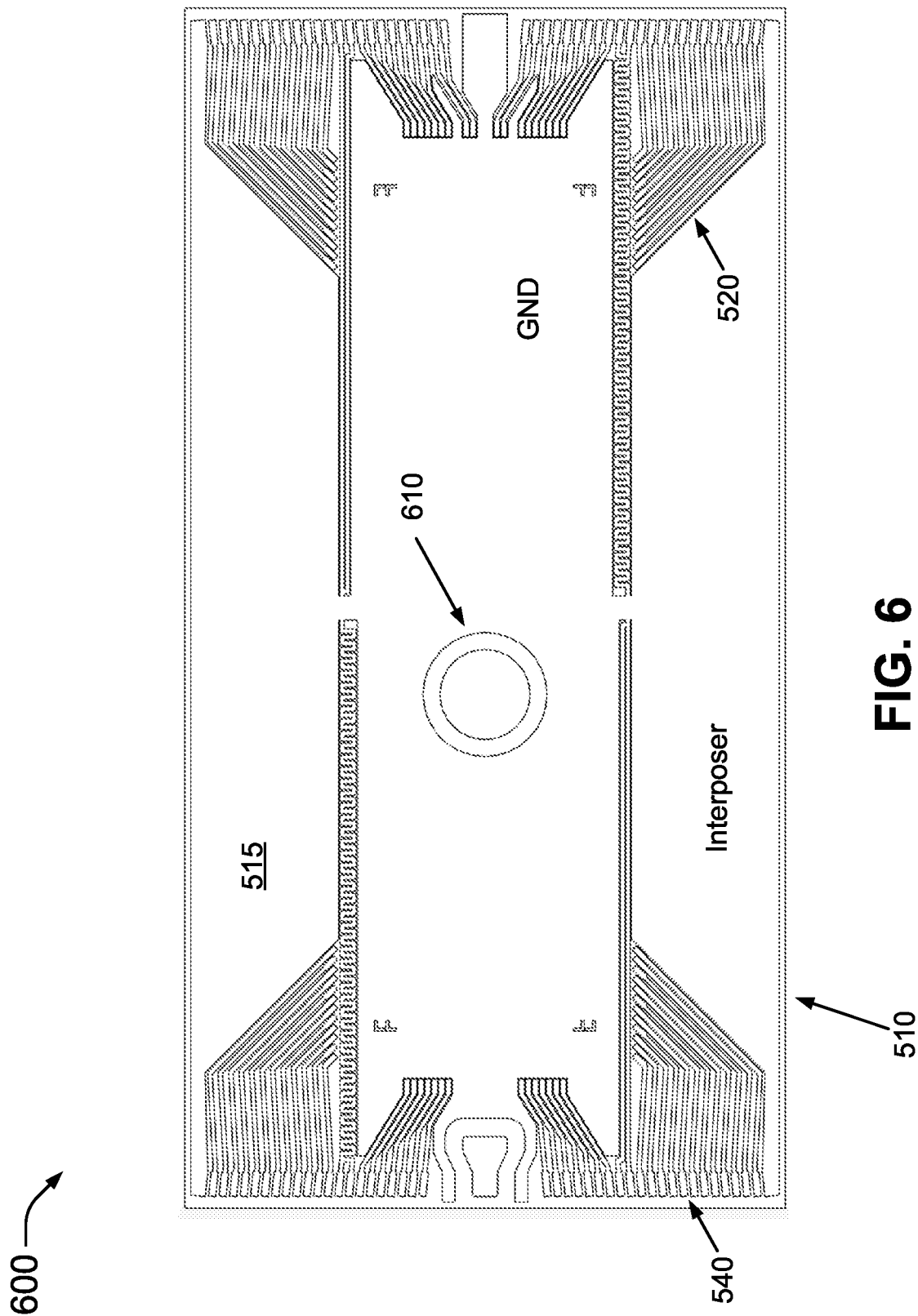
FIG. 6 illustrates a top view of an interposer with a load hole in connection with aspects of this disclosure.

FIG. 6 shows a diagram 600 that illustrates a top view of the interposer that is otherwise partially hidden by the ion trap in the diagram 500 in FIG. 5. The diagram 600 shows the interposer substrate 510, the top surface 515, the traces 520, and the contacts 510.

Also shown is an interposer load hole 610, which is in alignment with the ion trap load hole 450 when the interposer and the ion trap are attached to each other as in the diagram 500 in FIG. 5. By having this alignment, it is possible to backside load the assembly of the ion trap and the interposer by passing a plume of the atomic species to be ionized and confined from the bottom of the interposer to the top of the ion trap through the interposer load hole 610 and the ion trap load hole 450.

In addition to the interposer load hole 610 and the electrically isolated traces 520 that route closer to where the ion trap is attached, there is a large ground (GND) plane that fills most of the rest of the top surface 515.

Electrical routing in the interposer may involve more than one layer of routing, separated by an insulating dielectric material such as a polyimide.

Figure 7:
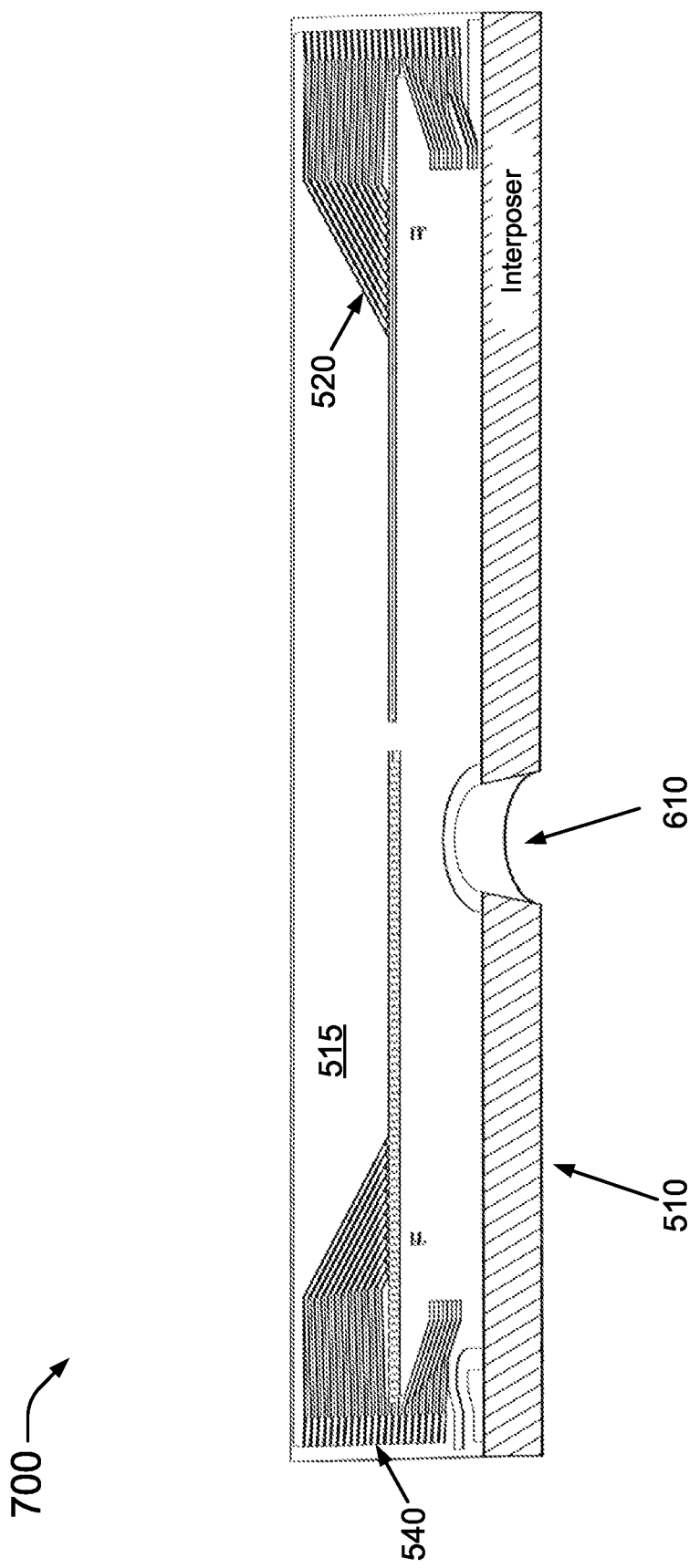
FIG. 7 illustrates a cross section of an interposer with a conical load hole configuration in connection with aspects of this disclosure.

FIG. 7 shows a diagram 700 that illustrates a cross section of the interposer with the interposer load hole 610 having a conical/tapered shape or configuration.

The tapering of the interposer load hole 610 allows a backside evaporation of metal to coat the interior wall of the tapered hole for electrical connectivity to the GND plane. As mentioned above, the interposer load hole 610 need not be conical or tapered and can instead be straight. Moreover, the interior wall of the interposer load hole 610 may be metalized or left exposed (e.g., not metallized).

In connection with the description of FIGS. 1-7 above, an interposer is described that is configured to be attached to a bottom surface of an ion trap. The interposer includes an electrically insulating substrate having a load hole through an entire thickness of the substrate, the load hole being positioned to align with a load hole of the ion trap when the ion trap is attached to the interposer. The substrate of the interposer may be made of sapphire or may be made of BeO. The load hole of the interposer may have a straight or vertical inner wall or may have a tapered or conical inner wall. The inner wall may be metallized and electrically connected to a ground plane on a top surface of the substrate. To improve optical access, the interposer may have angled traces on the top surface of the substrate that are configured for wire bonding to corresponding angled traces on a top surface of the ion trap.

In another aspect in connection with the description of FIGS. 1-7 above, an assembly is described that includes an ion trap and an interposer rigidly attached to a bottom surface of the ion trap, where the ion trap has a load hole through an entire thickness of the ion trap, and the interposer includes an electrically insulating substrate having a load hole through an entire thickness of the substrate of the interposer, and where the load hole of the interposer is positioned to align with the load hole of the ion trap. The interposer in the assembly may include one or more of the features described above.

In yet another aspect in connection with the description of FIGS. 1-7 above, a QIP system is describer that includes a chamber and an assembly having an ion trap rigidly attached to an interposer, and where the assembly is housed inside the chamber. The interposer in the assembly may include one or more of the features described above.

The previous description of the disclosure is provided to enable a person skilled in the art to make or use the disclosure. Various modifications to the disclosure will be readily apparent to those skilled in the art, and the common principles defined herein may be applied to other variations without departing from the scope of the disclosure. Furthermore, although elements of the described aspects may be described or claimed in the singular, the plural is contemplated unless limitation to the singular is explicitly stated. Additionally, all or a portion of any aspect may be utilized with all or a portion of any other aspect, unless stated otherwise. Thus, the disclosure is not to be limited to the examples and designs described herein but is to be accorded the widest scope consistent with the principles and novel features disclosed herein.

What is claimed is:

1. An interposer configured to be attached to a bottom surface of an ion trap, the interposer comprising:
   an electrically insulating substrate having a load hole through an entire thickness of the substrate, the load hole being positioned to align with a load hole of the ion trap when the ion trap is attached to the substrate of the interposer,
   wherein the substrate of the interposer has a top surface that comprises a larger area than the bottom surface of the ion trap and includes electrical contacts on the top surface that are outside the bottom surface of the ion trap.

2. The interposer of claim 1, wherein the substrate of the interposer is made of at least one of sapphire and beryllium oxide (BeO).

3. The interposer of claim 1, wherein the load hole of the interposer has a straight inner wall.

4. The interposer of claim 1, wherein the load hole of the interposer has a tapered inner wall.

5. The interposer of claim 4, wherein the tapered inner wall is metallized and electrically connected to a ground plane on the top surface of the substrate.

6. The interposer of claim 1, further comprising angled traces on the top surface of the substrate of the interposer configured for wire bonding to corresponding angled traces on a top surface of the ion trap.

7. An assembly, comprising:
   an ion trap; and
   an interposer that is separate and configured to be rigidly attached to a bottom surface of the ion trap,
   wherein the ion trap has a load hole through an entire thickness of the ion trap,
   wherein a top surface of the interposer comprises a larger area than the bottom surface of the ion trap and includes electrical contacts on the top surface of the interposer that are outside the bottom surface of the ion trap, and
   wherein the interposer includes an electrically insulating substrate having a load hole through an entire thickness of the substrate, the load hole of the interposer being positioned to align with the load hole of the ion trap when the ion trap is attached to the substrate of the interposer.

8. The assembly of claim 7, wherein the substrate of the interposer is made of sapphire.

9. The assembly of claim 7, wherein the substrate of the interposer is made of beryllium oxide (BeO).

10. The assembly of claim 7, wherein the load hole of the interposer has a straight inner wall.

11. The assembly of claim 7, wherein the load hole of the interposer has a tapered inner wall.

12. The assembly of claim 11, wherein the tapered inner wall is metallized and electrically connected to a ground plane on the top surface of the substrate of the interposer.

13. The assembly of claim 7, wherein the interposer includes angled traces on the top surface of the substrate that are configured for wire bonding to corresponding angled traces on a top surface of the ion trap.

14. A quantum information processing (QIP) system, comprising:
    a chamber; and
    an assembly that includes an interposer that is separate and configured to be rigidly attached to a bottom surface of an ion trap, the assembly being housed inside the chamber,
    wherein a top surface of the interposer comprises a larger area than the bottom surface of the ion trap and includes electrical contacts outside the bottom surface of the ion trap that are configured for electrical connectivity to additional components of the QIP system,
    wherein the ion trap has a load hole through an entire thickness of the ion trap, and
    wherein the interposer includes an electrically insulating substrate having a load hole through an entire thickness of the substrate, the load hole being positioned to align with the load hole of the ion trap when the ion trap is attached to the substrate of the interposer.

15. The QIP system of claim 14, wherein the substrate of the interposer is made of sapphire.

16. The QIP system of claim 14, wherein the substrate of the interposer is made of beryllium oxide (BeO).

17. The QIP system of claim 14, wherein the load hole of the interposer has a straight inner wall.

18. The QIP system of claim 14, wherein the load hole of the interposer has a tapered inner wall.

19. The QIP system of claim 18, wherein the tapered inner wall is metallized and electrically connected to a ground plane on top surface of the substrate of the interposer.

20. The interposer of claim 1, wherein the ion trap is separate from the interposer and configured to be mechanically attached to the top surface of the substrate of the interposer.

* * * * *